United States Patent [19]

Harano et al.

[11] Patent Number: 5,009,922
[45] Date of Patent: Apr. 23, 1991

[54] METHOD OF FORMING A TRANSPARENT CONDUCTIVE FILM

[75] Inventors: Takeshi Harano; Satoru Takaki; Yuzo Shigesato; Koichi Suzuki; Naoki Hashimoto, all of Yokohama; Hiroyasu Kojima, Ebina; Takuji Oyama, Yokohama, all of Japan

[73] Assignee: Ashahi Glass Company, Ltd., Tokyo, Japan

[21] Appl. No.: 486,841

[22] Filed: Mar. 1, 1990

[30] Foreign Application Priority Data

Mar. 2, 1989 [JP] Japan .................................. 1-48571
Mar. 14, 1989 [JP] Japan .................................. 1-59573
Mar. 28, 1989 [JP] Japan .................................. 1-73955

[51] Int. Cl.⁵ .............................................. B05D 3/06
[52] U.S. Cl. .......................................... 427/37; 427/38; 427/42; 427/47; 427/109; 427/126.2; 427/126.3; 427/314; 427/322

[58] Field of Search ...................... 427/38, 37, 47, 109, 427/126.2, 126.3, 314, 322

[56] References Cited

FOREIGN PATENT DOCUMENTS 63-223171 9/1988 Japan .

Primary Examiner—Bernard Pianalto
Attorney, Agent, or Firm—Oblon, Spivak, McClelland, Maier & Neustadt

[57] ABSTRACT

In a method of forming a transparent conductive film, an arc discharge type plasma produced by arc discharging is generated in an atmosphere wherein the pressure of an atmospheric gas is $3.0 \times 10^{-4}$ Torr or higher; the plasma is converged onto a vapor deposition material for forming a transparent conductive film to thereby evaporate the vapor deposition material, whereby said transparent conductive film is formed on a substrate located above said vapor deposition material.

9 Claims, 8 Drawing Sheets

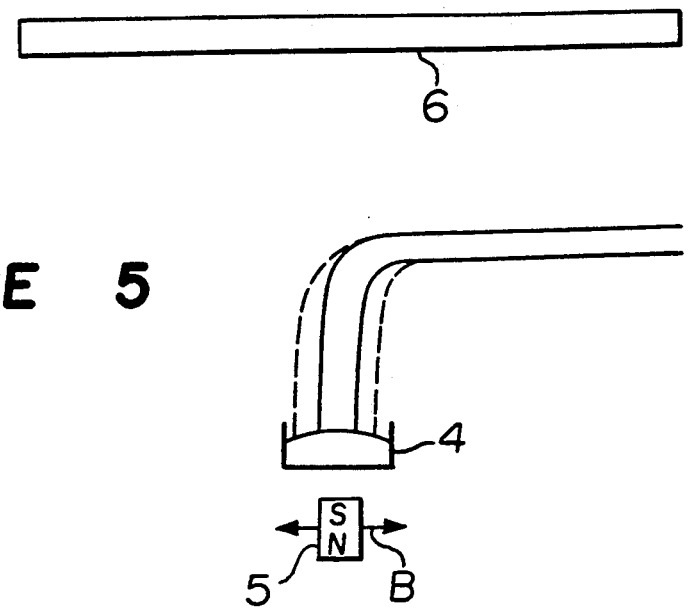
FIGURE 5
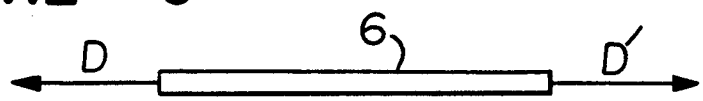
FIGURE 6
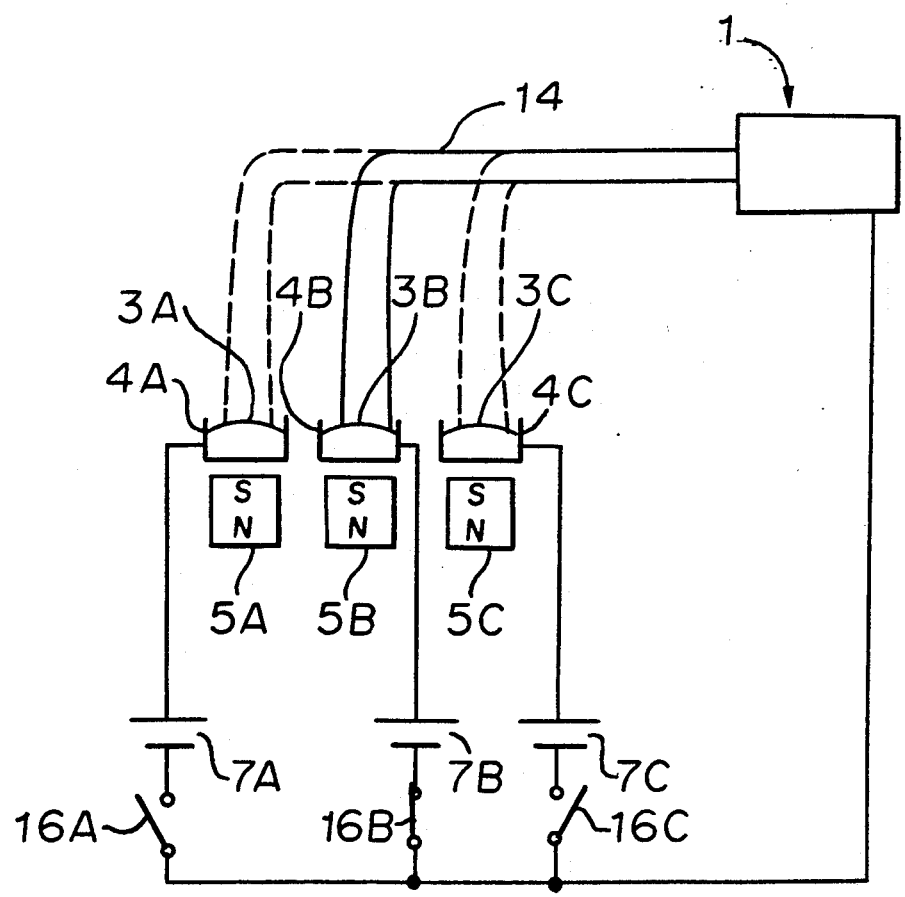

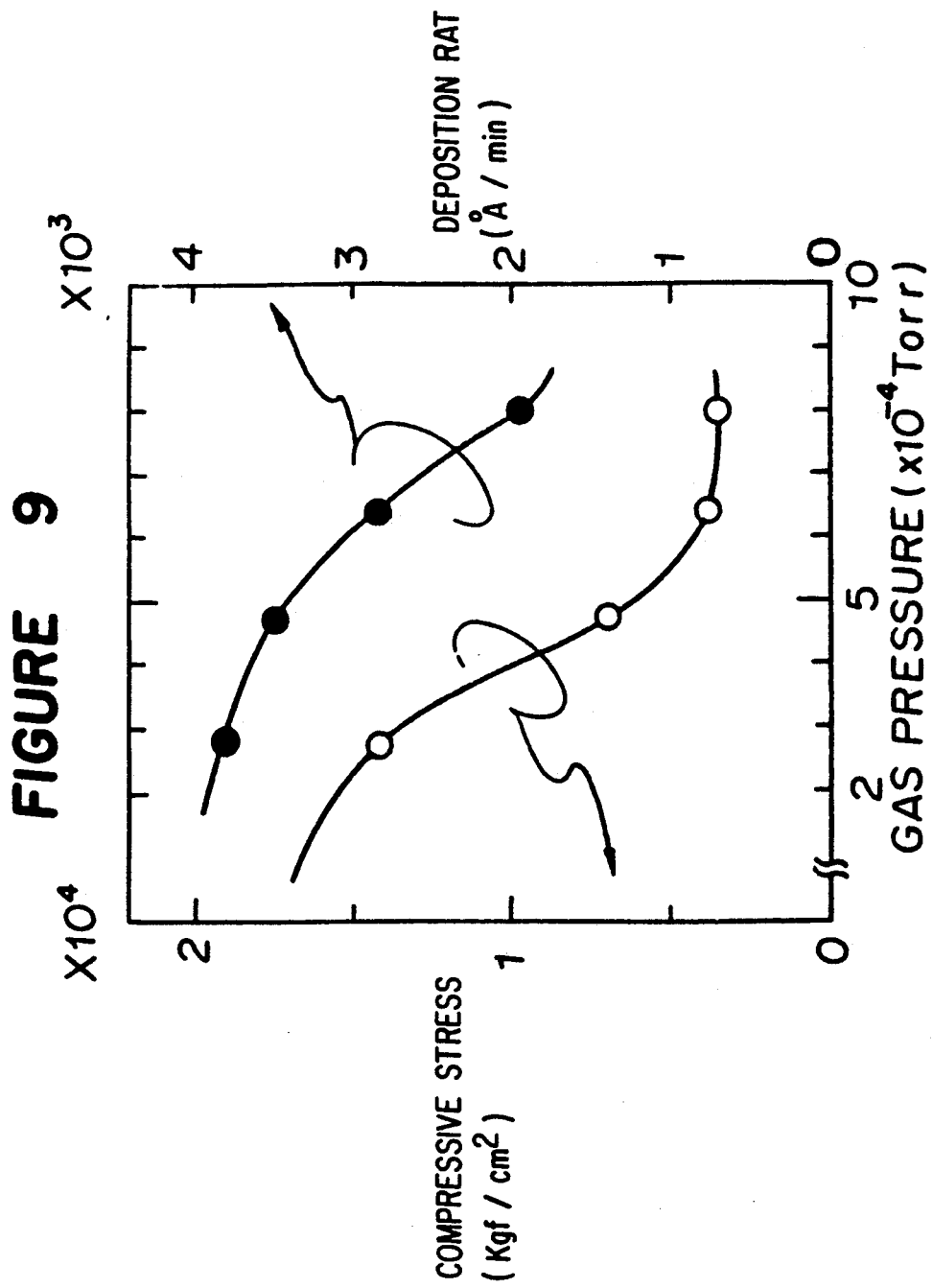

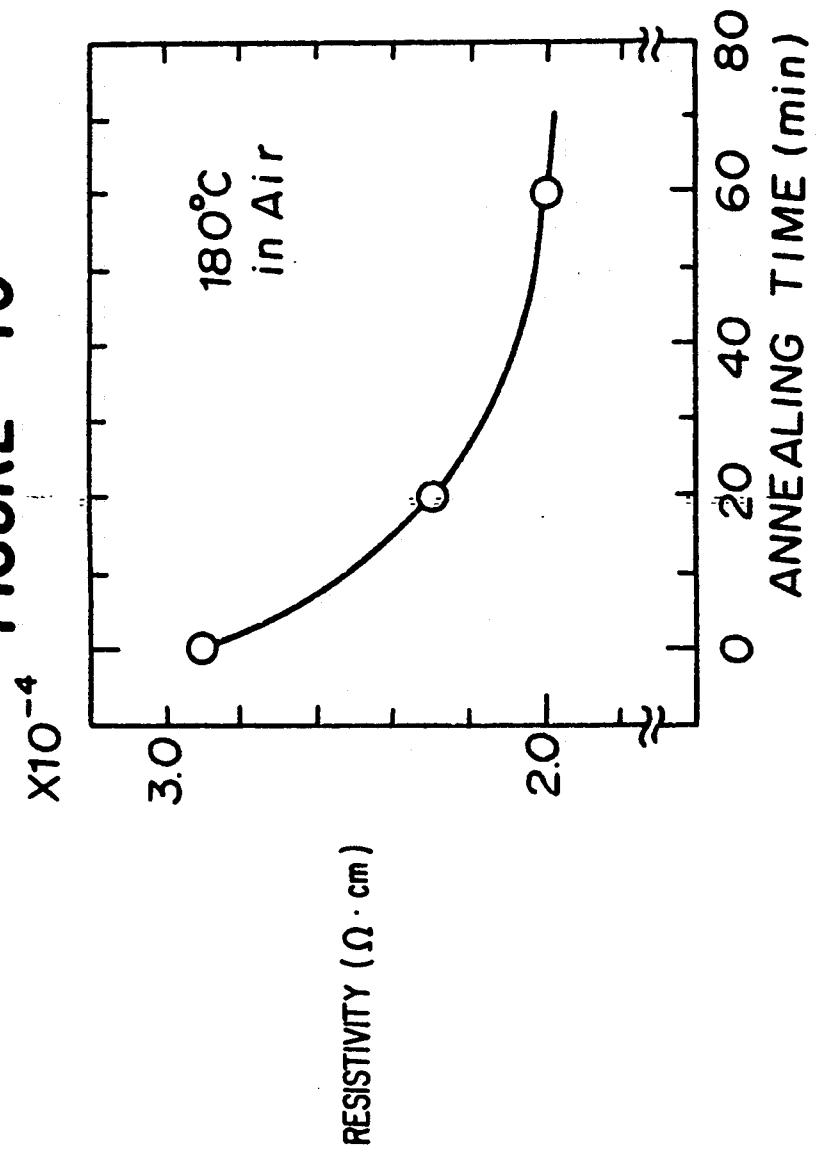

METHOD OF FORMING A TRANSPARENT CONDUCTIVE FILM

The present invention relates to a transparent substrate having a transparent conductive film and a method of forming such transparent conductive film.

Transparent conductive films composed of an oxide such as $In_2O_3$: Sn, $SnO_2$: F, $SnO_2$: Sb and ZnO: Al which are coated on transparent substrates such as inorganic glass or organic films have been used as transparent electrodes for displaying devices such as liquid crystal display (LCD), Electro-Luminescence Display (ELD). A typical example of the transparent conductive film is a tin-doped indium oxide film (ITO). Generally, a thin film of ITO is prepared by an electron beam vapor deposition method (EB vapor deposition method) or a DC magnetron sputtering method.

On the other hand, a highly dense plasma obtained by arc discharging has been utilized. In a method using such plasma, the density of the plasma is 50-100 times higher than that of a glow discharge type plasma which is utilized for a conventional magnetron sputtering method or an ion plating method. Further, the gas ionizing ratio is about several tens % and the density of ions, the density of electrons and the density of neutral activated particles are very high. By using mainly electron beams of a high density in the highly dense plasma, it is possible to evaporate a vapor deposition material more effectively than the conventional method, and it can be realized to form a film at a deposition rate 2-5 times higher than that by a coating method such as the conventional electron beam vapor deposition method (EB vapor deposition method) or the DC magnetron sputtering method. A much amount of the evaporated atoms and molecules of indium, oxygen or argon pass a highly dense plasma region above a vapor deposition hearth and they become ions showing high reactivity and neutral activated particles. As a result, they provide a highly reactive field on a substrate whereby a transparent conductive film having a low resistivity can be realized at a higher deposition rate than that obtained by the conventional EB vapor deposition method or the DC magnetron sputtering method. However, a large compressive stress as large as about 10,000 kgf/cm$^2$ remains in the ITO film. When the compressive stress is more than 5,000 kgf/cm$^2$, there may take place a curved portion in the substrate. If the ITO film with such a large compressive stress is formed on a color filter on a substrate, the color filter is peeled off from the substrate to thereby cause difficulty in using it as a conductive substrate with a color filter.

Heretofore, the ITO film having a low resistivity ($2 \times 10^{-4}$ $\Omega$cm) is formed by the electron beam vapor deposition method (EB vapor deposition method) or the DC magnetron sputtering method on an inorganic glass substrate heated to 300° C.-400° C. in order to increase reactivity and crystallization on the substrate. On the other hand, in a case that an organic material is used for the substrate or an ITO film is coated on an inorganic glass substrate attached with a color filter, which is used for a substrate for a liquid crystal color display, for example, the film is formed by the EB vapor deposition method or the DC magnetron sputtering method. However, since these substrates can not be heated at a higher temperature than 200° C., a sufficient reaction of indium to oxygen and a sufficient crystallization could not be obtained on the substrates, and accordingly, an ITO film having a low resistivity ($<4 \times 10^{-4}$ $\Omega$cm) could not be realized. As an alternative method of the heating of the substrates, a technique of activation by utilizing a plasma obtainable by, for instance, ion plating has been used. However, the ionization ratio of gas or a vapor deposition material is as low as 1% or lower because the ion plating or the magnetron sputtering obtain a plasma by utilizing a so-called glow discharge. Accordingly, the number of chemically active ions and neutral activated particles, which are necessary to effectively form a transparent conductive film of an oxide such as ITO, is not sufficient. Although some improvement in the quality of the film can be expected, a transparent film of a low resistivity which is obtainable in a case that the substrate is heated to 300° C.-400° C. is difficult to obtain. Accordingly, it was necessary to increase the thickness of the film in order to obtain a low sheet resistance and to make the deposition rate very low to increase transparency. Therefore, it took much time to form the film in comparison with the method of forming a film on a sufficiently heated substrate.

On the other hand, with the propagation of a large-sized colored liquid crystal display device with a high resolution, some limitation has been applied to the thickness of a film for a transparent electrode from the viewpoint of the high resolution and the high transmittance. Further, a transparent electrode having a low resistance has become indispensable from the viewpoint of the large-sized device and the high response. It was very difficult that the thin ITO film obtained by the conventional low temperature film forming method satisfied such demands, and it became a large obstacle to realize a colored liquid crystal display device having a high performance.

It is an object of the present invention to eliminate the above-mentioned problems and to provide a method of forming a transparent conductive film characterized in that an arc discharge type plasma produced by arc discharging is generated in an atmosphere wherein the pressure of an atmospheric gas is $3.0 \times 10^{-4}$ Torr or higher; the plasma is converged onto a vapor deposition material for forming a transparent conductive film to thereby evaporate the vapor deposition material, whereby said transparent conductive film is formed on a substrate located above said vapor deposition material.

In drawings:

FIG. 5 is a diagram for explaining a case that a hearth is relatively moved with respect to a permanent magnet;

FIG. 6 is a diagram showing a case that a plurality of hearth are used;

FIG. 9 is a graph showing a relation among gas pressure, compressive stress and deposition rate in a case that an ITO film is formed in an atmosphere of 100% of Ar; and FIG. 10 is a graph showing a relation of annealing time to resistivity of an ITO film formed by the method of the present invention.

Detailed description of preferred embodiments of the present invention will be described with reference to the drawings.

Figure 1:
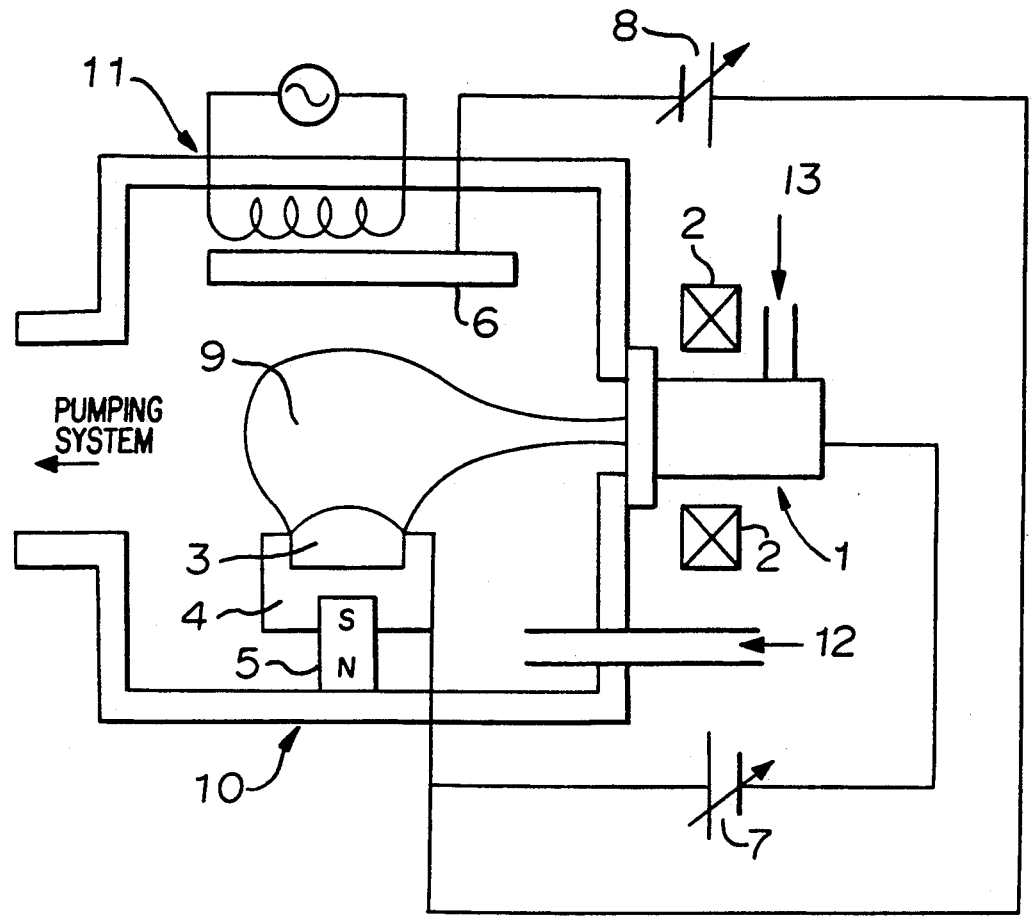
FIGS. 1, 3 and 7 are respectively diagrams showing, as examples, the basic construction of apparatuses used for forming a film in accordance with the method of the present invention.
Figure 3:
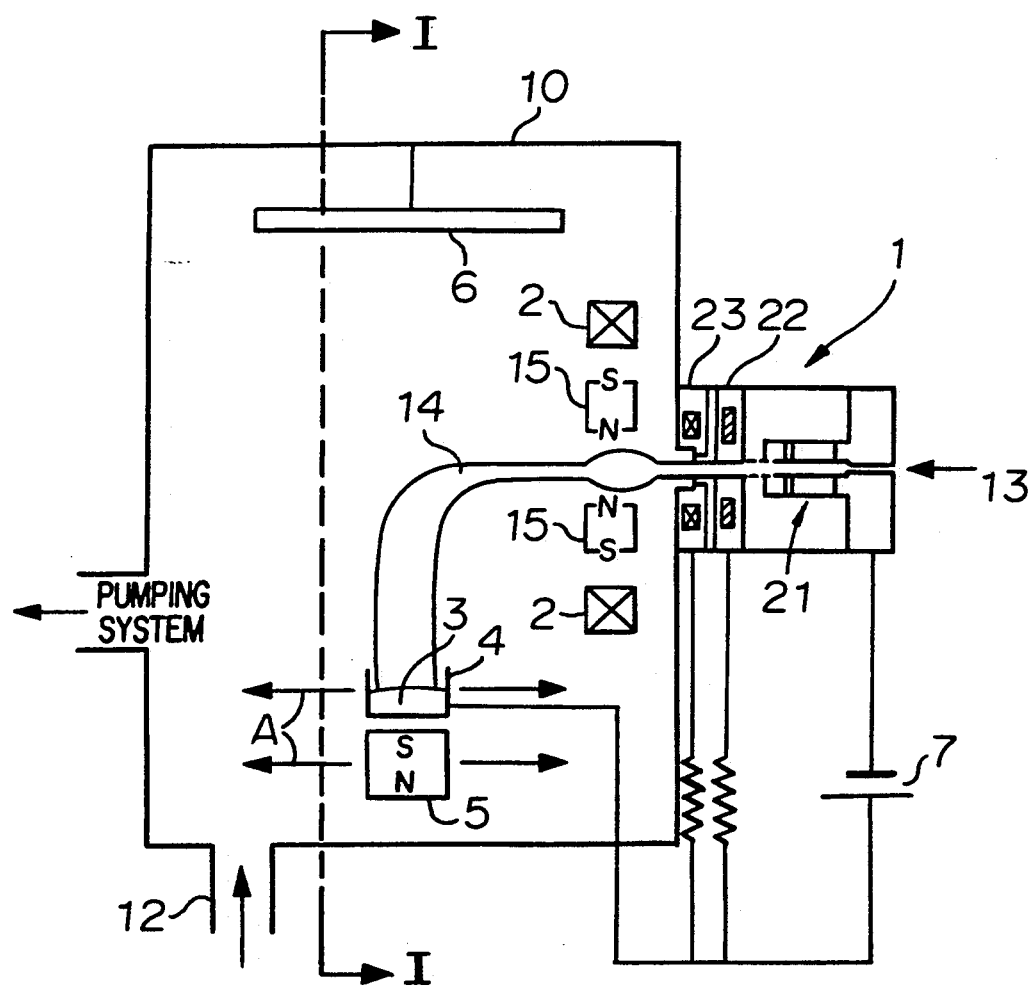
Figure 4:
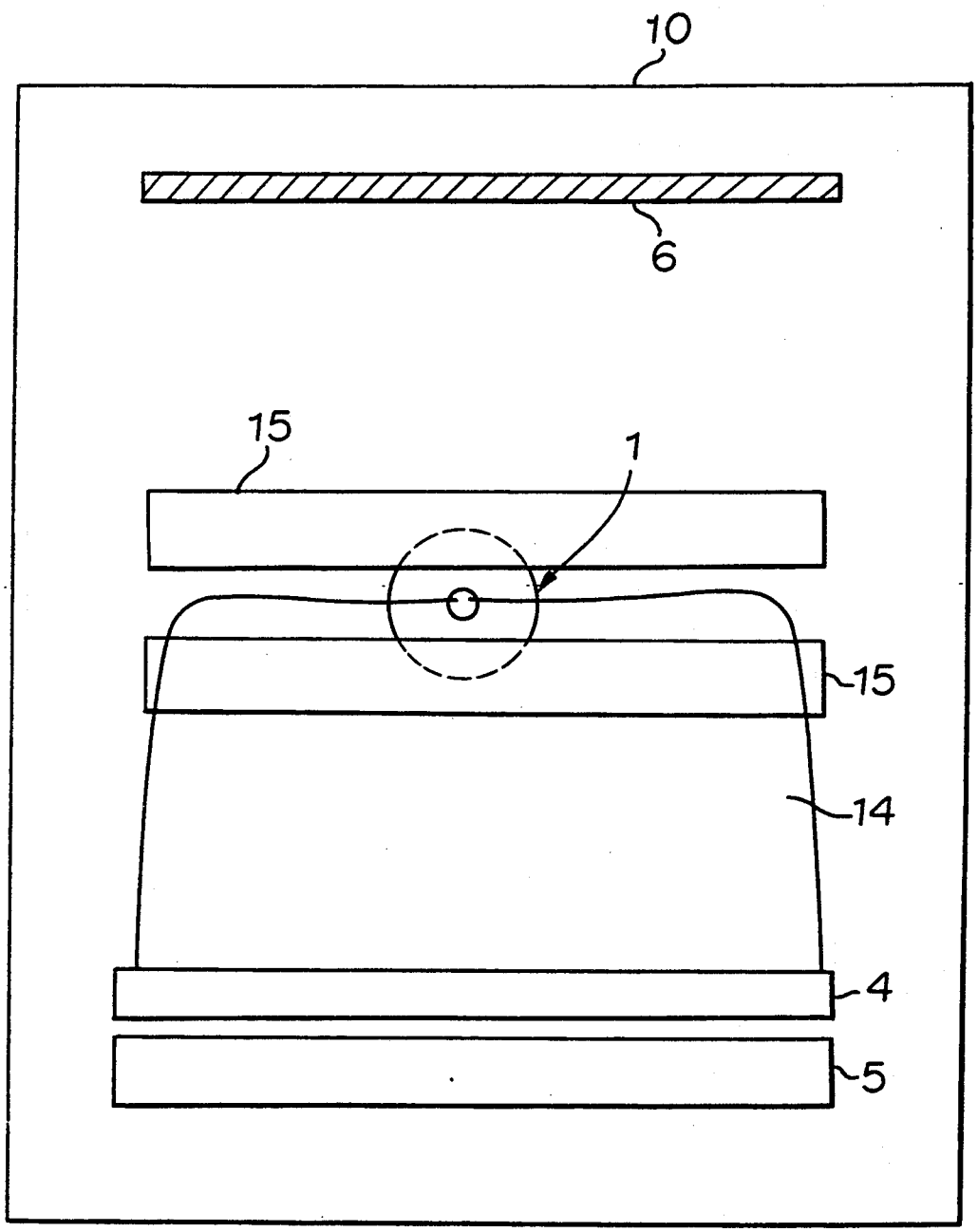
FIG. 4 is a cross-sectional view taken along a line I—I in FIG. 3.

FIGS. 1 and 3 are respectively diagrams showing the basic construction of embodiments of an apparatus used for forming a film in accordance with the method of the present invention. FIGS. 1 and 3 illustrate cases that a substrate on which a film is formed is fixed. FIG. 4 is a cross-sectional view taken along a line I—I in FIG. 3.

In the present invention, a plasma obtained by arc discharging is used. The arc discharge type plasma is produced by the arc discharge which is resulted by applying a d.c. voltage for producing a plasma across an arc discharge type plasma stream generating source 1 and an anode (hearth) 4.

As a method of producing an arc discharge type highly dense plasma in the present invention, it is preferable to use the plasma generating source 1 capable of generating a highly dense plasma by utilizing the arc discharging.

As such arc discharge type plasma generating source 1, it is preferable to use a composite cathode type plasma generating apparatus or a pressure gradient type plasma generating apparatus, or a combination of the above-mentioned plasma generating apparatuses. Such plasma generating apparatuses are disclosed in a publication "Shinku" Vol. 25, No. 10 (published in 1982).

Figure 2:
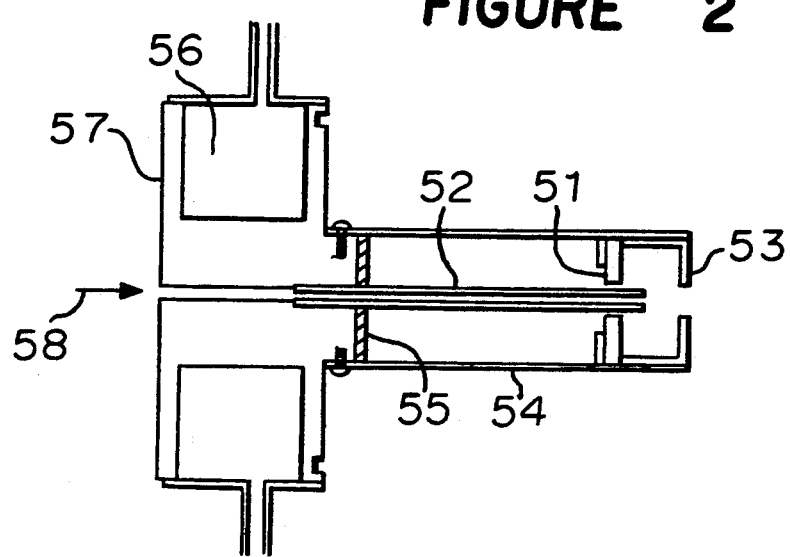
FIG. 2 is a longitudinal cross-sectional view of an embodiment of a composite cathode as the cathode of an arc discharge type plasma generating apparatus used for the method according to the present invention.

The composite cathode type plasma generating apparatus is such an apparatus having an auxiliary cathode having a small heat capacity and a main cathode of $LaB_6$ wherein an initial discharge is concentrated to the auxiliary cathode; the main cathode $LaB_6$ is heated by using the initial discharge, and an arc discharge is produced from the main cathode $LaB_6$ as the final cathode. FIG. 2 shows an example of such plasma generating apparatus. The auxiliary cathode may be of a coil form, or a disk form or a pipe form made of metal having a high melting point such as W, Ta, Mo or the like.

In the above-mentioned composite cathode type plasma generating apparatus, the auxiliary cathode 52 having a small heat capacity is concentratedly heated by the initial discharge so a to operate it as an initial cathode, whereby the main cathode 51 of $LaB_6$ is indirectly heated, and finally an arc discharge is caused by the main cathode 51 of $LaB_6$. Accordingly, there is a great advantage that further increase in temperature in the auxiliary cathode 52 is avoidable since the main cathode 51 of $LaB_6$ is heated at a temperature of 1,500° C.-1,800° C. to thereby generate a large current of electrons before the auxiliary cathode 52 is heated to a temperature higher than 2,500° C., which may adversely affect the lifetime of the apparatus.

In the pressure gradient type plasma generating apparatus, an intermediate electrode is disposed between a cathode and an anode so that an electric discharge is effected by providing a pressure of about 1 Torr in a region of the cathode and a pressure of about $10^{-3}$ Torr in a region of the anode. In the pressure gradient type plasma generating apparatus, there is little danger of a damage in the cathode due to a reverse flow of ions from the region of anode, and a large current electric discharge is possible because efficiency of a carrier gas to produce electron beams for the arc discharge is remarkably high in comparison with an electric discharging method without using the intermediate electrode.

The composite cathode type plasma generating apparatus and the pressure gradient type plasma generating apparatus respectively have the advantages described above. Thus, a plasma generating apparatus in combination of the features of the above-mentioned apparatus, i.e., a plasma generating apparatus in which there is an intermediate electrode as well as a composite cathode as a cathode is desirable as the arc discharge type plasma generating source 1 usable in the present invention since the above-mentioned advantages can be simultaneously obtained.

FIG. 3 shows an embodiment of an arc discharge type plasma generating source 1 which comprises a composite cathode 21 as shown in FIG. 2, a first intermediate electrode 22 including an annular permanent magnet and a second intermediate electrode 23 including an air-core coil.

The construction of a vapor deposition chamber 10 will be described with reference to FIG. 1. A magnetic field is formed in the axial direction of a plasma gun by the air-core coil 2 wherein the orientation of the magnetic field formed is in the direction of the output of the plasma gun. In the vapor deposition chamber, a vapor deposition substrate 6 is arranged opposing a vapor deposition material 3 and a vapor deposition hearth (anode) 4 with respect to the axial line (as the center) of the plasma gun. A magnet 5 is arranged just below the vapor deposition hearth 4 in order to bend the plasma stream toward the hearth 4. In this case, the magnet 5 is arranged so that the S pole is located near the hearth 4 and the N pole is located remote from it, in order to converge effectively the magnetic line of force from the plasma gun 1 on the hearth. Further, a voltage from a battery 7 is applied across the plasma gun 1 and the vapor deposition hearth 4 so that the hearth 4 has a positive potential to the plasma gun 1, whereby the vapor deposition material 3 is heated and evaporated mainly by the electrons in the plasma. The vapor deposition substrate 6 as an object is arranged opposing the vapor deposition hearth 4. In this case, the vapor deposition substrate may be heated by a heater 11, or a d.c. voltage or an RF voltage 8 may be applied thereto.

The arc discharge type plasma generating source shown in FIG. 3 will be described. In FIG. 3, the same reference numerals designate the same parts. The anode (hearth) 4 is disposed in the lower portion of the plasma generating source 1, and a highly dense plasma stream produced by an arc discharge produced from the plasma generating source 1 by means of the air core coil 2 is drawn in the vacuum chamber 10. A pair of permanent magnets 15 are arranged with their N poles facing each other in order to transform the drawn plasma into a sheet form. The plasma is between the hearth 4 and the substrate 6 and the surface of the N pole or the S pole of each of the permanent magnets is arranged so as to be parallel to the main surface of the hearth 4 or the substrate 6 on which a film is formed so that the plasma is deformed in the direction parallel to the hearth 4 or the substrate 6 to form the sheet plasma 14.

The sheet plasma 14 deformed into a sheet form by the magnetic field of the pair of permanent magnets 15 has its thickness in view of the longitudinal direction of the drawing and its width (which is clearly shown in FIG. 4) in the direction perpendicular to FIG. 3.

The sheet plasma 14 is bent about 90° by a magnetic field formed by the action of the permanent magnet 5 which is located below the hearth 4, and is gathered on the hearth 4. As a result, the vapor deposition material 3 in the hearth 4 is evaporated, and evaporated particles deposit on the substrate 6 located above the hearth 4, whereby a film is formed on the substrate 6.

In the present invention, the permanent magnet 5 has preferably the same length as the hearth 4 at least in the width direction of the sheet plasma as shown in FIG. 4 since the sheet plasma 14 uniformly falls on the material to be vaporized in the hearth 4 so as to effectively use the material.

Further, in the present invention, it is preferable that the permanent magnet 5 and the hearth 4 have the same length as the substrate 6 at least in the width direction of the sheet plasma 14 as shown in FIG. 4 since the vapored material from the hearth 4 can be uniformly deposited on the substrate 6 from the width direction of the sheet plasma.

Further, in the present invention, the hearth 4 and the permanent magnet 5 may be moved in the direction of arrow marks A in FIG. 3, i.e. they may be moved together in planes which are parallel to the substrate 6. With such movement, the material evaporated from the hearth 4 uniformly deposits on the substrate 6 in the direction perpendicular to the plane in the width direction of the sheet plasma, whereby occurrence of uneven thickness of a film on the substrate 6 between a portion just below the hearth 4 and a portion apart from the portion just below the hearth 4 can be prevented.

It is further possible that as shown in FIG. 5, a permanent magnet 5 thinner than the hearth 4 is used, and the permanent magnet 5 is relatively moved to the hearth 4 in the direction indicated by a character B in FIG. 5 so that the plasma uniformly falls on the hearth 4. With this arrangement, efficiency in using the material to be evaporated is increased. It is particularly effective when a valuable metal oxide is used for the material to be evaporated. The movement of the permanent magnet in the direction of the arrow mark B can be combined with the parallel movement in the direction of the arrow mark A as shown in FIG. 3.

Figure 7:
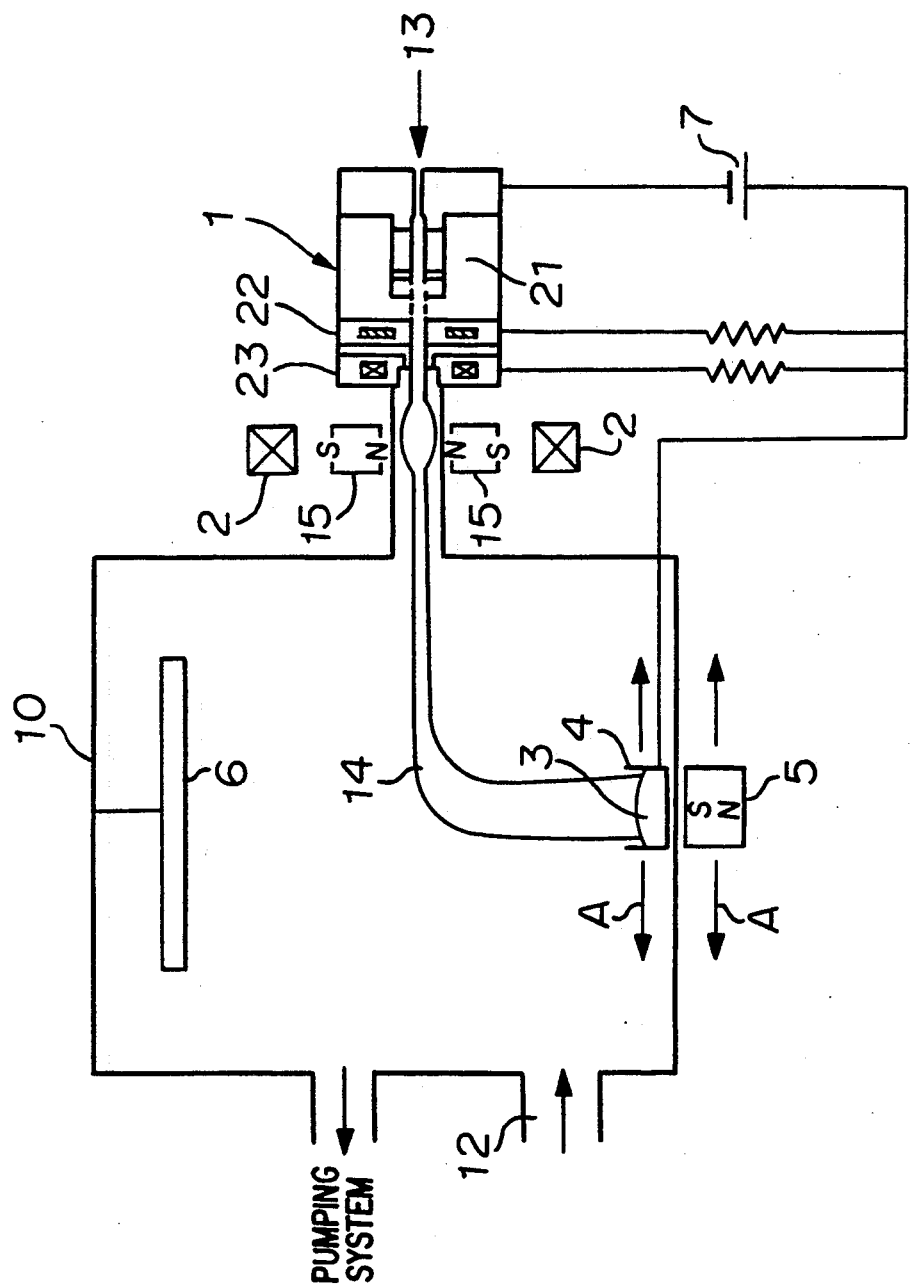

Further, ion plating can be conducted by using an arrangement as shown in FIG. 7 that the hearth 4 and the substrate 6 on which a film is formed are arranged in the vacuum chamber 10 and a thin rectangular permanent magnet 5 is placed outside the vacuum chamber 5 and below the earth 4. In this case, it is necessary that a portion interposed between the hearth 4 at the bottom of the vacuum chamber 10 and the permanent magnet 5 is made of a material which does not shield a magnetic field. With the above-mentioned arrangement, the width and the thickness of the sheet plasma 14 and a plasma density can be controlled from the outside of the vacuum chamber 10 through the bottom surface of the chamber 10 by changing the permanent magnet 5. The width, the length of the sheet plasma and the plasma density are changed depending on materials to be evaporated 3, and the permanent magnet 5 used and a power applied to the arc discharge type plasma stream generating source 1. In this case, the sheet plasma can be sufficiently controlled when the shape and the strength of the magnetic field of the permanent magnet can be desirably changed. As described above, the permanent magnet 5 can be replaced to change the shape, and the distance between the permanent magnet 5 and the hearth 4 can be changed, without the modification of the inside of the vacuum chamber 10, by disposing the permanent magnet 5 outside the vacuum chamber 10.

This greatly contributes to form a multilayered film having different kinds of material and to the stabilization in a continuous production system.

A gas for arc discharge is introduced through a gas inlet port 13, and a reaction gas is introduced through a reaction gas inlet port 12.

In the present invention, a film is formed under the condition that the total gas pressure is $3.0 \times 10^{-4}$ Torr or higher, preferably in a range of $3.0 \times 10^{-4} - 3.0 \times 10^{-3}$ Torr, in order to reduce the compressive stress of the film to be formed. When the gas pressure decreases, the compressive stress tends to increase. When the gas pressure is $3.0 \times 10^{-4}$ Torr or lower, it is difficult to form a thin film having the compressive stress of 5,000 kgf/cm$^2$ or lower.

Ar gas is normally used as a gas to produce a plasma stream by an arc discharge since the Ar gas has good ability of ionization and the ionization voltage is low as 15 V–16 V, whereby it easily causes an arc discharge. However, when the Ar gas is used to cause the arc discharge, the resulted plasma stream is introduced in a vacuum and it is contained in a film formed by vapor deposition on the substrate. When the Ar gas is contained in the film, the compressive stress may increase. Accordingly, when a material having a high compressive stress is used to form a film, for instance, when a nitride film or a thick film is formed, cracks are easily formed in the film or the peeling-off of the film is easily caused. Use of He gas does not cause any problem on the compressive stress even though the gas is contained in the film because the diameter of He atom is smaller than that of Ar atom.

Accordingly, it is desirable that when a film having a compressive stress of 5,000 kgf/cm$^2$ or lower is formed and an atmospheric gas of He or a gas containing mainly He is used, the gas pressure is $3.0 \times 10^{-4}$ Torr or higher, or when an atmospheric gas of a Ar or a gas containing mainly Ar is used, the gas pressure is $5.0 \times 10^{-4}$ Torr or higher.

FIG. 9 shows a relation of a compressive stress and a deposition rate to gas pressure when an ITO film is formed in an atmosphere of 100% of Ar. It is understood from FIG. 9 that the gas pressure should be $5 \times 10^{-4}$ Torr or higher when a film having a compressive stress of 5,000 kgf/cm$^2$ or lower.

On the other hand, when the gas pressure is high, the compressive stress decreases and the deposition rate tends to decrease. It was found that the deposition rate is rapidly reduced when the gas pressure is $3.0 \times 10^{-3}$ Torr or higher. Accordingly, in the present invention, the film should be formed under the atmospheric condition of the total gas pressure of $3.0 \times 10^{-3}$ Torr or lower. Use of the He gas realizes an evaporation rate further higher than that with use of Ar gas. It can be considered that the ionization voltage of the He gas is high as 24 V–25 V in comparison with the Ar gas, and electrons in the plasma stream which are applied to the material to be evaporated in the hearth are accelerated, whereby the evaporation rate of the material is increased.

When the He gas is used as an inert gas for an arc discharge, a film having a relatively small compressive stress is resulted even when the total gas pressure is reduced to about $3.0 \times 10^{-4} - 2.0 \times 10^{-3}$ Torr. Accordingly, the deposition rate can be increased in comparison with a case that the Ar gas is used.

In the present invention, a gas mixture of He and Ar may be used as an arc discharge gas in consideration of the compressive stress and the thickness of the film to be formed.

When the gas mixture of He and Ar is used, the total gas pressure can be suitably selected in consideration of a gas pressure required in a case of 100% of He and in a case of 100% of Ar.

Although the inert gas such as Ar, He is used as an atmospheric gas in order to produce effectively a plasma, such inert gas may contain 0–50 volume % of oxygen gas as a reaction gas.

When the oxygen gas is incorporated, the compressive stress of a film to be formed is not substantially influenced by the magnitude of oxygen because the oxygen is a structural element of a transparent conductive film to be formed, but depends on the value of the total gas pressure of the atmospheric gas. Incorporation of 0–50 volume % of oxygen gas facilitates to form a transparent conductive film having a low resistance. If the oxygen gas is contained in an amount more than 50 volume %, there causes increase in the resistivity, and therefore it is sufficient that the amount to be incorporated is 50% or lower.

In the highly dense arc discharge plasma used for the present invention, a large quantity of the atoms of an inert gas such as active argon are produced in addition to active metallic atoms and oxygen atoms. Under the conventional film forming condition wherein the total gas pressure is low as $3.0 \times 10^{-4}$ Torr or lower, the atoms of inert gas enter into the thin film during the formation of the film to thereby expand the atom-atom distance (lattice constant) so that a large compressive stress of about 10,000 kgf/cm$^2$ is resulted in the thin film. An amount of Ar gas entering in the ITO film is estimated by a fluorescent X-ray analyzing method or a PIXE analyzing method, and the displacement of the lattice constant is obtained by an X-ray analysis in which an amount of a shift in the angle of diffraction of a diffraction peak and a peak profile are found. Further, the compressive stress can be measured by a technique such as a cantilever method.

In the present invention, it is possible to reduce the compressive stress in the ITO film by increasing the total gas pressure during the formation of film to be $3.0 \times 10^{-4}$ Torr or higher. The reason is considered as follows. When the average distance of free movement (mean free path) of the atoms and molecules in a gas phase is shortened by increasing the total gas pressure, the energy of the atoms entering in the ITO film by bombarding can be reduced. As a result, the number of atoms entering into the ITO film is reduced to thereby reduce the compressive stress. Further, the reduction of the compressive stress can be considered as follows. When He gas is used as an inert gas for arc discharge, the amount of the displacement of the lattice constant is small (since the radius of a He atom is small) in comparison with another inert gas such as Ar gas even though the same number of atoms enter into the ITO film, whereby the compressive stress is small.

In the present invention, as the substrate 6 on which a thin film is formed, a substrate or a film made of a material such as glass, plastic resin or metal is usable, but it is not particularly limited. In the present invention, however, since a film having a high quality is obtainable without heating the substrate, a substrate or a film of plastic resin or a glass plate on which an organic polymer film is previously formed, e.g. a glass plate for a liquid crystal color display having a color filter film can be satisfactorily used, for instance.

As the thin film formed on the substrate according to the method of the present invention, a thin film made of a material such as metal, alloys, metal oxides, nitrides, borides, silicates, carbides or a mixture containing one or more kinds of these materials, but it is not limited thereto. The method of the present invention is preferable to obtain a transparent conductive film of a low resistance and a high transmittance. As a preferred example of such transparent conductive film, a film of tin-containing indium oxide, antimony-containing tin oxide, aluminum-containing zinc oxide or the like may be exemplified.

As the material 3 to be evaporated to obtain a transparent conductive film, a sintered product of tin-containing indium oxide, antimony-containing tin oxide, aluminum-containing zinc oxide or the like is usable. Among these, a sintered product of indium oxide containing 0–10 wt % of tin is most preferable because a transparent conductive film having the lowest resistivity can be obtained.

Since the highly dense plasma used in the present invention utilizes an arc discharge, the density of plasma is 50–100 times higher than a glow discharge type plasma which has been used in the conventional magnetron sputtering or ion plating. Further, ionization ratio of gas is several tens %, and the ion density, the electron density and the neutral activated particles density are very high. Thus, it is possible to more effectively heat and evaporate the material than the conventional method, by mainly a highly dense electron stream in the highly dense plasma, whereby a deposition rate of a film 2–5 times as high as the conventional coating method can be realized. Further, much amount of the atoms or molecules of evaporated indium, oxygen or argon pass the highly dense plasma region above the vapor deposition hearth, and become ions having high reactivity or neutral activated particles. As a result, reactivity on the substrate is increased, and a transparent conductive film of a low resistivity can be realized at higher speed than the conventional method even at a temperature of substrate of 200° C. or lower.

Although a film having a low resistivity can be formed at a high speed as described above, such transparent conductive film formed by using the method of the present invention can be annealed to further reduce the resistivity.

FIG. 10 is a diagram showing how the resistivity of an ITO film ($2.9 \times 10^{-4}$ Ω.cm) formed by the method of the present invention is reduced when it is annealed at 180° C. in air.

The method of the present invention is applicable to produce a transparent electrode for display such as a liquid crystal display device, an electrode such as a solar battery, infrared reflecting window glass, electromagnetic shielding window glass, low-emissibity window glass and so on.

In the process of the present invention, the substrate 6 may be placed stationary or moved during the formation of a film. A preferable way is to move the substrate from the left to the right or from the right to the left in FIG. 3, namely, from the front side of the paper surface to the back side in the perpendicular direction in FIG. 4, or from the back side to the front side in the perpendicular direction during which a film forming operation is conducted so that a uniform layer is continuously formed on the substrate in the width direction of the sheet plasma.

In the present invention, a sheet plasma having a thickness of 0.5-3 cm and a width of 10-50 cm can be easily formed by adjusting the power of the d.c. power source 7 for the arc discharge type plasma generating source 1 and the length and the intensity of magnetic force of the permanent magnet 15 which deforms the plasma into a sheet form. Further, the width, the shape and the density of the sheet plasma falling on the hearth 4 can be changed by changing the length and the strength of the magnetic force of the permanent magnet 5.

Figure 8:
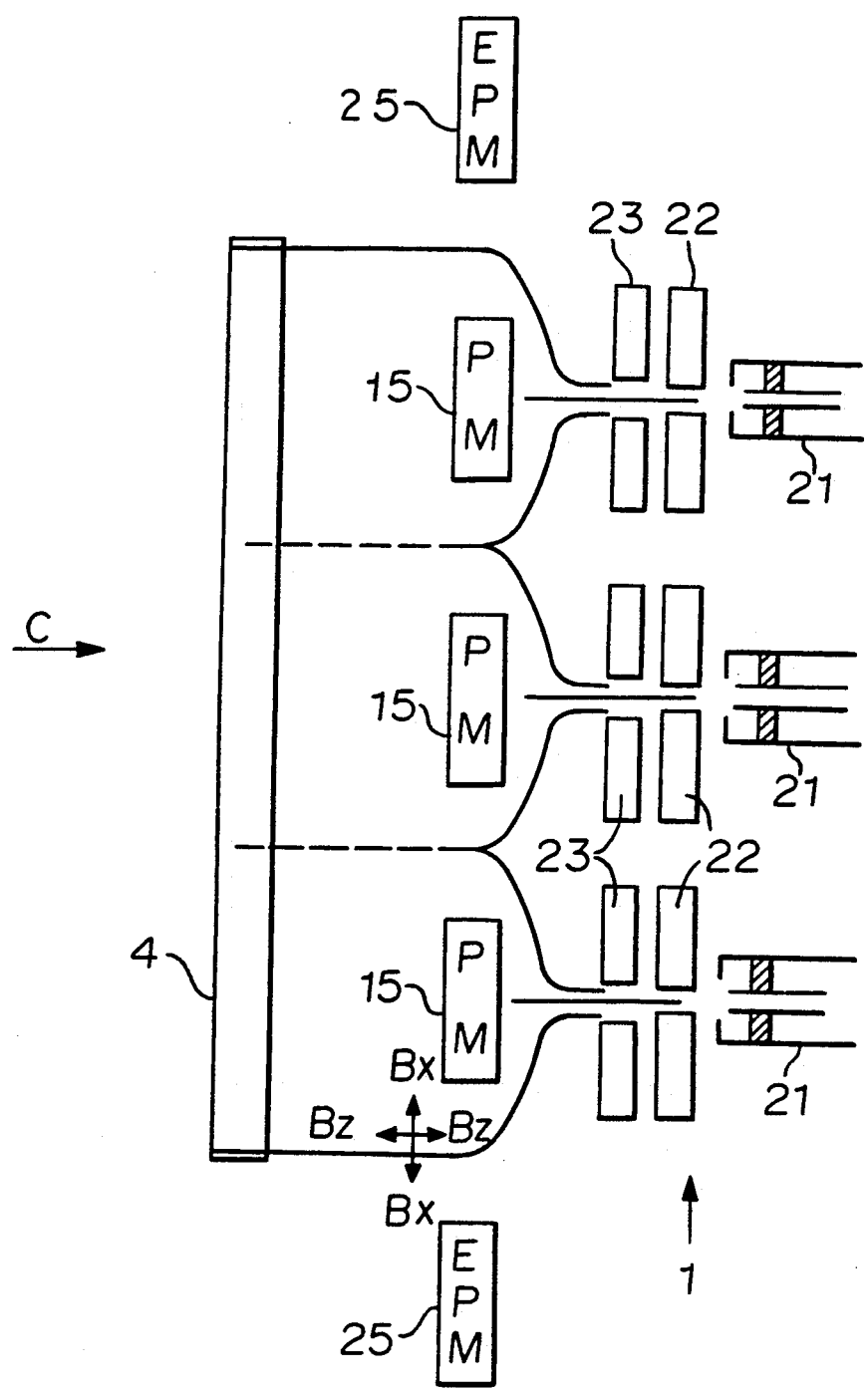
FIG. 8 is a diagram showing a sheet plasma having a large surface area which is formed by forming a plurality of sheet plasmas in a side-by-side relation.

It is further possible as shown in FIG. 8 that plasmas generated from two or more plasma generating sources 1 are respectively deformed into a sheet form by a suitable magnetic field forming means (specifically by means of a permanent magnet or magnets 15) so that the sheet plasmas are arranged in the same plane in a side-by-side relation to form a single sheet plasma having a large surface area, and the sheet plasma is directed onto the hearth 4 located at the lower portion to thereby evaporate the material. FIG. 8 illustrates a case that three apparatuses as in FIG. 3 are adjacently arranged wherein the apparatuses are viewed from the upper portion in FIG. 3. In such case that a plurality of the sheet plasmas are arranged in an adjacent relation, it is necessary to dispose additional pairs of permanent magnets 25 on the line of extension of the line connecting the plurality of permanent magnets 15 and the outside of both ends of the sheet plasma so that the symmetry of a magnetic field component $B_x$ in the direction of the width of the sheet plasma by the permanent magnets 15 can be kept.

The hearth 4 may be a single elongated piece as shown in FIG. 8, or may be a plurality of relatively short pieces in which different kinds of vapor deposition materials are placed. In either case, the substrate on which a thin film is formed may be stationary or moved. In the later case, when the substrate is moved in the direction of an arrow mark C, a thin film having a large surface area can be uniformly formed at a high speed.

It is possible that multilayers are continuously produced by assembling the film forming apparatus as shown in FIG. 3 in a part of an in-line type film forming apparatus wherein another film forming apparatus for forming a sputtered film or a vapor-deposited film is used. It is important to conduct film-forming by using the most desired technique for the material for the multi-layered film. In particular, when a vapor deposition method is used for forming a sheet plasma having a large surface area, there is a problem of the distribution in thickness of a film produced. However, such problem can be improved by using the sheet plasma of the present invention.

As shown in FIG. 6, ion plating can be conducted by using a plurality of hearths in which different materials 3A, 3B, 3C to be evaporated are placed. In FIG. 6, it is preferable that each of the hearths 4A, 4B, 4C and the permanent magnets 5A, 5B, 5C has at least the same width as the substrate 6 as shown in FIG. 4. By selecting switches 16A, 16B, 16C, a film composed of a single or two or more compositions can be formed on the substrate 6. FIG. 6 shows a case that only the switch 16B is ON so that a sheet plasma 14 is solely converged on the material 3B, whereby a film is formed on the substrate 6 by vaporizing the material 3B. This arrangement unnecessitates job-changing to replace materials to be evaporated in the in-line type apparatus; this greatly reduces cost.

The density of the sheet plasma falling on the material to be evaporated can be adjusted by selectively operating two or more switches to supply a desired amount of power of the d.c. power sources 7A, 7B, 7C, whereby the evaporation rate can be controlled and the composition of the film composed of a plurality of components can be controlled.

By reducing the width of the hearths 4A, 4B, 4C and by bringing many kinds of hearth into a closely contacting relation, a film composed of several specified compositions can be uniformly formed. In particular, further good result can be obtained by moving the substrate 6 in the direction of an arrow mark D or D'.

In the method of forming a transparent conductive film of the present invention, an arc discharge plasma may be deformed in a sheet form by means of a magnet means 15 as shown in FIGS. 3 and 7, or it may not be always necessary to deform the arc discharge plasma in a sheet form as shown in FIG. 1.

EXAMPLE 1

The vapor deposition apparatus (as shown in FIG. 1) having the arc discharge type plasma generating source as shown in FIG. 3 was used. As a material to be evaporated, a sintered product of indium oxide containing 7.5 wt % of tin was used. A pressure in the vacuum chamber 10 was reduced to $2 \times 10^{-5}$ Torr. He gas was introduced through a gas inlet port 11 to the plasma generating apparatus having a composite cathode as shown in FIG. 2, and arc discharging was conducted by supplying a power (150 A, 110 V) from a d.c. power source 7. Then, oxygen gas and He gas were introduced so that the atmospheric gas pressure was adjusted to $4 \times 10^{-4}$ Torr, and vapor deposition was conducted. The distance between a hearth 4 and the substrate 6 was about 60 cm and the substrate was fixed. A film having a film thickness of 16,800 Å, a resistivity of $2.85 \times 10^{-4}$ Ω.cm, a compressive stress of $3.0 \times 10^3$ kgf/cm$^2$ and a visible light transmittance of 70% (substrate glass 92%) was obtained. The deposition rate was 12,000 Å/min which was very high in comparison with EB vapor deposition method. Although the vapor deposition was conducted without heating the substrate, the resistivity was fairly low.

COMPARATIVE EXAMPLE 1

The same apparatus and the same vapor deposition material as in Example 1 were used, and an ITO film was formed as follows. A pressure in the vacuum chamber 10 was reduced to $2 \times 10^{-5}$ Torr. Ar gas was introduced through the gas inlet port 11 to the plasma generating apparatus (as shown in FIG. 3) having the composite cathode as shown in FIG. 2. Arc discharging was conducted by supplying a power (250 A, 70 V) from the d.c. power source 4. Oxygen gas and Ar gas were introduced so that the atmospheric gas pressure was adjusted to $4 \times 10^{-4}$ Torr, and the vapor deposition was conducted. The distance between a hearth 4 and the substrate 6 was about 60 cm, and the substrate was fixed. A film having a film thickness of 14,800 Å, a resistivity of $3.05 \times 10^{-4}$ Ω.cm, a compressive stress of 10,000 kgf/cm$^2$ and a visible light transmittance (Tv) of 70% (Tv of a substrate glass 92%) was obtained. The deposition rate was 5,000 Å/min which was very high in comparison with the method by an EB gun. Although the vapor deposition was conducted without heating the substrate, the resistivity was fairly low.

EXAMPLE 2 and COMPARATIVE EXAMPLE 2

A vapor deposition apparatus (as shown in FIG. 1) having a plasma generating apparatus as shown in FIG. 3 was used. As a material to be evaporated, a sintered product of indium oxide including 7.5 wt % of tin was used. An ITO film was formed on a non-alkali glass plate (AN glass manufactured by Asahi Glass Company Ltd.) which was previously heated at 400° C.

The vacuum chamber was evacuated to have a pressure of $1 \times 10^{-5}$ Torr or lower. Then, Ar gas was introduced to the plasma generating source and a discharge current of 200 A was supplied to generate a highly dense plasma. Then, a shutter was opened and film forming operation was conducted for 1 minute to form an ITO film while the substrate was fixed. Table 1 shows the characteristics of ITO films coated under different conditions of gas pressure. The compressive stress was measured by a cantilever method.

EXAMPLE 3 and COMPARATIVE EXAMPLE 3

The vapor deposition apparatus (as shown in FIG. 1) having the arc discharge type plasma generating source as shown in FIG. 3 was used. As a material to be evaporated, a sintered product of indium oxide containing 7.5 wt % of tin was used. An ITO film was formed on a non-alkali glass plate (AN glass manufactured by Asahi Glass Company Ltd.) having an organic color filter thereon which was previously heated at 200° C.

The vacuum chamber was evacuated to have a pressure of $1 \times 10^{-5}$ Torr or lower, and Ar gas was introduced to the plasma generating source. A discharge current of 200 A was supplied to generate a highly dense plasma. Then, the shutter was opened. Film forming was conducted for 1 minute to form an ITO film while the substrate was fixed. Table 2 shows the characteristics of ITO films coated under different conditions of pressure and a partial pressure of oxygen of 15%. The compressive stress was measured by a cantilever method.

TABLE 1

Formation of ITO on a substrate heated at a high temperature

|  | Example 2 | Comparative Example 2 |
|---|---|---|
| Total gas pressure (mTorr) | 1.5 | 0.3 |
| Deposition rate (Å/min) | 2,800 | 3,000 |
| Resistivity (Ω · cm) | $1.3 \times 10^{-4}$ | $1.2 \times 10^{-4}$ |
| Compressive stress (kgf/cm$^2$) | 3,000 | 14,000 |
| Transmittance (%) | 82 | 82 |
| Warpage in substrate[1] (μm) | Nil | 700 |
| Patterning[2] | Good | Peeling |

[1] 300 mm sq, 1.1 mm thick, AN glass substrate
[2] 100 μm width pattern

TABLE 2

Formation of ITO on a substrate heated at a low temperature

|  | Example 3 | Comparative Example 3 |
|---|---|---|
| Total gas pressure (mTorr) | 1.6 | 0.3 |
| Deposition rate (Å/min) | 2,800 | 3,000 |
| Resistivity (Ω · cm) | $2.1 \times 10^{-4}$ | $2.0 \times 10^{-4}$ |
| Compressive stress (kgf/cm$^2$) | 3,000 | 14,000 |
| Transmittance (%) | 82 | 82 |
| Warpage in substrate[1] (μm) | Nil | Yes*[1] |
| Color filter | No change | Peeling |

TABLE 2-continued

Formation of ITO on a substrate heated at a low temperature

|  | Example 3 | Comparative Example 3 |
|---|---|---|
| Patterning[2] | Good | *[1] |

[1] 300 mm sq, 1.1 mm thick, AN glass substrate
[2] 100 μm width pattern
*[1] Immeasurable due to the peeling-off of color filter

EXAMPLE 4

The vapor deposition apparatus having the arc discharge type plasma generating source as shown in FIG. 3 was used. As a material to be evaporated, a sintered product of indium oxide including 7.5 wt % of tin was used. An ITO film was formed on a non-alkali glass plate (AN glass manufactured by Asahi Glass Company Ltd.) which was previously heated at 200° C.

The vacuum chamber was evacuated to have a pressure of $1 \times 10^{-5}$ Torr or lower. Ar gas was introduced in the plasma generating apparatus 1 and a discharge current of 250 A was supplied to thereby generate a highly dense plasma. Then, Ar gas and oxygen gas were introduced in the chamber so that the pressure of the atmospheric gas was $1 \times 10^{-3}$ Torr and the inert gas contained 40 vol % of oxygen. Then, the shutter was opened and the substrate was fixed. Film forming was conducted for 1 minute to form an ITO film. A voltage applied across the plasma generating source and the hearth was 60 V and a temperature rise in the substrate during the film forming operations was 200° C. or lower. The characteristics of the coated ITO film are as follows. Film thickness: 3,000 Å, resistivity: $2.0 \times 10^{-4}$ Ωcm, compressive stress: 3,000 kgf/cm$^2$, transmittance at a wavelength of 550 nm: 82%.

EXAMPLE 5

An ITO film was obtained in the same manner as Example 4 except that a non-alkali glass substrate (AN glass manufactured by Asahi Glass Company Ltd.) was used as a low temperature substrate on which a color filter for liquid crystal display having a heat resistance temperature of 200° C. was previously coated was used. Even in this case, ITO film characteristics having a high performance was obtained in the same manner as those in Example 4. No deterioration of the color filter was resulted.

EXAMPLE 6

An ITO film was formed in the same manner as Example 1 except that an atmospheric gas of 100% of He and the atmospheric gas pressure of $3 \times 10^{-4}$ Torr were used. The compressive stress and the resistivity of the ITO film were respectively 5,000 kgf/cm$^2$ and $2.9 \times 10^{-4}$ Ω.cm.

COMPARATIVE EXAMPLE 4

An ITO film was formed in the same manner as Example 1 except that an atmospheric gas of 100% of He and a gas pressure of $2.5 \times 10^{-4}$ Torr were used. The compressive stress and the resistivity of the ITO film were respectively 6,000 kgf/cm$^2$ and $2.9 \times 10^{-4}$ Ω.cm.

EXAMPLE 7

An ITO film was formed in the same manner as Comparative Example 1 except that an atmospheric gas of 80% of Ar and 20% of He and the atmospheric gas pressure of $5\times 10^{-4}$ Torr were used. The compressive stress and the resistivity of the ITO film were respectively 4,700 kgf/cm$^2$ and $2.95\times 10^{-4}$ Ω.cm.

EXAMPLE 8

An ITO film was formed in the same manner as Comparative Example 1 except that an atmospheric gas of 50% of Ar and 50% of He and the atmospheric gas pressure of $5\times 10^{-4}$ Torr were used. The compressive stress and the resistivity of the ITO film were respectively 4,500 kgf/cm$^2$ and $2.9\times 10^{-4}$ Ω.cm.

EXAMPLE 9

An ITO film was formed in the same manner as Comparative Example 1 except that an atmospheric gas of 50% of Ar, 40% of O$_2$ and 10% of He and the atmospheric gas pressure of $5\times 10^{-4}$ Torr were used. The compressive stress and the resistivity of the ITO film were respectively 4,500 kgf/cm$^2$ and $2.8\times 10^{-4}$ Ω.cm.

In accordance with the present invention, there can be provided a substrate with a color filter for a liquid crystal display which permits the formation of a transparent conductive film having the same resistivity or lower than that of a conventional transparent conductive film and a small compressive stress without causing the peeling-off of the color filter, on an inorganic glass substrate or an inorganic glass substrate coated with an organic film or an organic layer which is difficult to be heated, at a deposition rate (about 2,000 Å/min –5,000 Å/min) 2-5 times higher than a deposition rate (e.g., about 1,000 Å/min–2,000 Å/min in a magnetron sputtering method). Also the present invention permits the formation of transparent electrode having a low sheet resistance as half as that obtained by a conventional method such as an EB vapor deposition method or the magnetron sputtering method even when the film thickness of the transparent conductive film is the same without heating the substrate to a high temperature. Therefore, the substrate with highly conductive ITO electrode obtained by the present invention can remarkably improve the response and the resolution of a liquid crystal display.

Generally, when a highly dense arc discharge plasma is used, discharge gas tends to be taken into a film formed. However, in the present invention, a film having a low compressive stress can be formed at a high deposition rate by using He gas having a small atomic radius as the discharge gas.

By using the He gas for arc discharging instead of Ar gas, a discharge voltage is increased to further accelerate the electrons in the plasma stream, whereby the evaporation rate of a material to be evaporated becomes high. Accordingly, a quantity of current in the He gas can be small in comparison with that in the Ar gas when the same evaporation rate is to be resulted.

In the present invention, it is possible to form a film having a low compressive stress at a high deposition rate without heating the substrate on which the film made of various kinds of compound is formed. This is particularly advantageous in a case that a film having a high compressive stress, such as a film of nitride is formed, or a film having a thickness of several micron meters is formed.

In the present invention, since it is possible to produce the optimum plasma stream by using a suitable magnet means depending on a kind of material to be used for forming a thin film, the optimum film can be formed. Namely, for a substrate having a large surface area, the width of the sheet plasma is broaden to improve the uniformity of the distribution of film thickness on the substrate 6 to thereby form a uniform film, and contrary, by using a small permanent magnet 5 to make the sheet plasma into a form of point to thereby increase concentration to the hearth 4, whereby a material difficult to be evaporated can be easily evaporated.

In the present invention, it is possible to increase the uniformity of the distribution of film thickness for a substrate having a large surface area by moving the hearth 4 and the magnet 5 in a parallel relation. Accordingly, a multilayer having a large surface area can be formed by using a plurality of the hearth 4.

Further, by relatively moving the hearth 4 and the permanent magnet 5, efficiency of utilization for the material to be evaporated 3 in the hearth can be remarkably improved.

We claim:

1. A method of forming a transparent conductive film characterized in that an arc discharge type plasma produced by arc discharging is generated in an atmosphere wherein the pressure of an atmospheric gas is $3.0\times 10^{-4}$ Torr or higher; the plasma is converged onto a vapor deposition material for forming a transparent conductive film to thereby evaporate the vapor deposition material, whereby said transparent conductive film is formed on a substrate located above said vapor deposition material.

2. The method of forming a transparent conductive film according to claim 1, wherein the atmospheric gas is He or a gas containing He.

3. The method of forming a transparent conductive film according to claim 1, wherein the atmospheric gas is Ar or a gas containing Ar and the pressure of the atmospheric gas is $5.0\times 10^{-4}$ Torr or higher.

4. The method of forming a transparent conductive film according to anyone of claims 1 through 3, wherein the transparent conductive film has a compressive stress of 500 kgf/cm$^2$ or lower.

5. The method of forming a transparent conductive film according to claim 4, wherein the transparent conductive film contains as the major component one selected from the group consisting of indium oxide, tin oxide and zinc oxide.

6. The method of forming a transparent conductive film according to claim 5, wherein said transparent conductive film is formed on the substrate at the temperature of 200° C. or higher, and wherein it is essentially composed of a tin-doped indium oxide and has a compressive stress of 5000 kgf/cm$^2$ or lower and a resistivity of $2\times 10^{-4}$ Ω.cm or lower.

7. The method of forming a transparent conductive film according to claim 5, wherein said transparent conductive film is formed on the substrate at the temperature of 200° C. or lower, and wherein it is essentially composed of a tin-doped indium oxide and has a compressive stress of 5000 kgf/cm$^2$ or lower and a resistivity of $3\times 10^{-4}$ Ω.cm or lower.

8. A method of preparing a conductive substrate with a color filer characterized in that a color filter is formed on a substrate; and when the substrate is at the temperature of 200° C. or lower, a transparent conductive film essentially composed of a tin-doped indium oxide wherein the compressive stress if 5000 kgf/cm$^2$ or lower and the resistivity is $3\times 10^{-4}$ Ω.cm or lower, is formed on said color filter in accordance with the method as described in claim 5.

9. The method of forming a transparent conductive film according to anyone of claims 1 through 3, or the method of preparing a conductive substrate with a color filter according to claim 8, wherein an arc discharge plasma is deformed in a form of sheet by applying a magnetic field to the plasma, and the sheet plasma is guided onto a vapor deposition material by the magnetic field of an elongated permanent magnet extending in the width direction of the sheet plasma so that the transparent conductive film is formed on a substrate located above the vapor deposition material.

* * * * *